(12) United States Patent
Chiang et al.

(10) Patent No.: US 7,939,432 B2
(45) Date of Patent: May 10, 2011

(54) METHOD OF IMPROVING INTRINSIC GETTERING ABILITY OF WAFER

(75) Inventors: Chun-Ling Chiang, Hsinchu (TW); Jung-Yu Hsieh, Hsinchu (TW); Ling-Wu Yang, Hsinchu (TW)

(73) Assignee: MACRONIX International Co., Ltd., Hsinchu (TW)

(*) Notice: Subject to any disclaimer, the term of this patent is extended or adjusted under 35 U.S.C. 154(b) by 211 days.

(21) Appl. No.: 12/334,829

(22) Filed: Dec. 15, 2008

(65) Prior Publication Data
US 2010/0151657 A1 Jun. 17, 2010

(51) Int. Cl.
*H01L 21/322* (2006.01)
*H01L 21/335* (2006.01)
*H01L 21/8232* (2006.01)

(52) U.S. Cl. ......... 438/477; 438/471; 438/473; 438/143
(58) Field of Classification Search .................. 438/471, 438/473, 477, 143
See application file for complete search history.

(56) References Cited

U.S. PATENT DOCUMENTS

| 4,597,804 | A | 7/1986 | Imaoka |
| 5,674,756 | A | 10/1997 | Satoh et al. |
| 6,190,631 | B1 * | 2/2001 | Falster et al. ................ 423/348 |
| 6,191,010 | B1 * | 2/2001 | Falster ......................... 438/471 |
| 6,245,311 | B1 | 6/2001 | Kobayashi et al. |
| 6,361,619 | B1 * | 3/2002 | Falster et al. ................ 148/33.2 |
| 6,818,569 | B2 * | 11/2004 | Mun et al. .................... 438/799 |

FOREIGN PATENT DOCUMENTS
TW 589414 6/2004
TW I256086 6/2006

OTHER PUBLICATIONS

Seiichi Isomae et al., "Intrinsic Gettering of Copper in Silicon Wafers" 2002 Journal of the Electrochemical Society, vol. 149, No. 6, pp. G343-347.

* cited by examiner

*Primary Examiner* — Luan C Thai
(74) *Attorney, Agent, or Firm* — J.C. Patents

(57) ABSTRACT

A method of improving the intrinsic gettering ability of a wafer is described. A first annealing step is performed to the wafer at a first temperature in an atmosphere containing at least one of oxygen gas and nitrogen gas. A second annealing step is performed to the wafer, at a second temperature higher than the first temperature, in the atmosphere.

11 Claims, 1 Drawing Sheet

METHOD OF IMPROVING INTRINSIC GETTERING ABILITY OF WAFER

BACKGROUND OF THE INVENTION

1. Field of the Invention

This invention relates to semiconductor technology, and more particularly to a method of improving the intrinsic gettering ability of a wafer with a low defect density.

2. Description of the Related Art

Single-crystal silicon wafers are the bases of most of IC fabrications. A single-crystal silicon wafer is usually got by slicing a silicon ingot formed with a Czochralski method. A wafer obtained from the earlier Czochralski method, which is called a CZ wafer in usual, has quite a few micro-defects and is thus not suitable for an advanced semiconductor process with a small critical dimension. Although a method including Si-epitaxy and subsequent annealing has been developed to improve the surface quality of a CZ wafer, the method is quite complicated greatly increasing the production cost.

An advanced Czochralski method was then developed for forming wafers with a very low defect density, wherein the silicon ingot is drawn from a melt of silicon in a lower drawing speed and in a constant ratio of drawing speed to rotation speed. A wafer cut from such a silicon ingot is usually called a Perfect Silicon wafer in the art.

However, since a Perfect Silicon wafer has a very low bulk micro-defect (BMD) density, its intrinsic gettering ability is quite poor so that undesired metal impurities easily diffuse to the active areas significantly affecting the device properties. Thus, it is highly desired to improve the intrinsic gettering ability of a wafer with a low BMD density, such as a Perfect Silicon wafer.

SUMMARY OF THE INVENTION

In view of the foregoing, this invention provides a method of improving the intrinsic gettering ability of a wafer with a low BMD density.

The method of improving the intrinsic gettering ability of a wafer is as follows. A wafer is provided. A first annealing step is performed to the wafer at a first temperature in an atmosphere containing at least one of oxygen gas and nitrogen gas. A second annealing step is performed to the wafer, at a second temperature higher than the first temperature, in the atmosphere.

The wafer provided may have a BMD density lower than $3.85 \times 10^5/cm^3$. Such a wafer is possibly a Perfect Silicon wafer. Usually, the above first temperature is between 650° C. and 850° C. and the second temperature is between 1000° C. and 1200° C. In an embodiment, the first annealing step is conducted for 4-12 hours and the second annealing step conducted for 12-16 hours. In an embodiment, the temperature in the transition period between the first annealing step and the second annealing step is raised in a rate of 1-5° C./min.

By utilizing this invention, a wafer originally with a low BMD density, such as a Perfect Silicon wafer, can be greatly increased in the BMD density without increasing the surface defects thereof. Hence, the wafer can be greatly improved in the intrinsic gettering ability without adversely affecting the device properties.

It is to be understood that both the foregoing general description and the following detailed description are exemplary, and are intended to provide further explanation of the invention as claimed.

DESCRIPTION OF THE PREFERRED EMBODIMENTS

Figure 1:
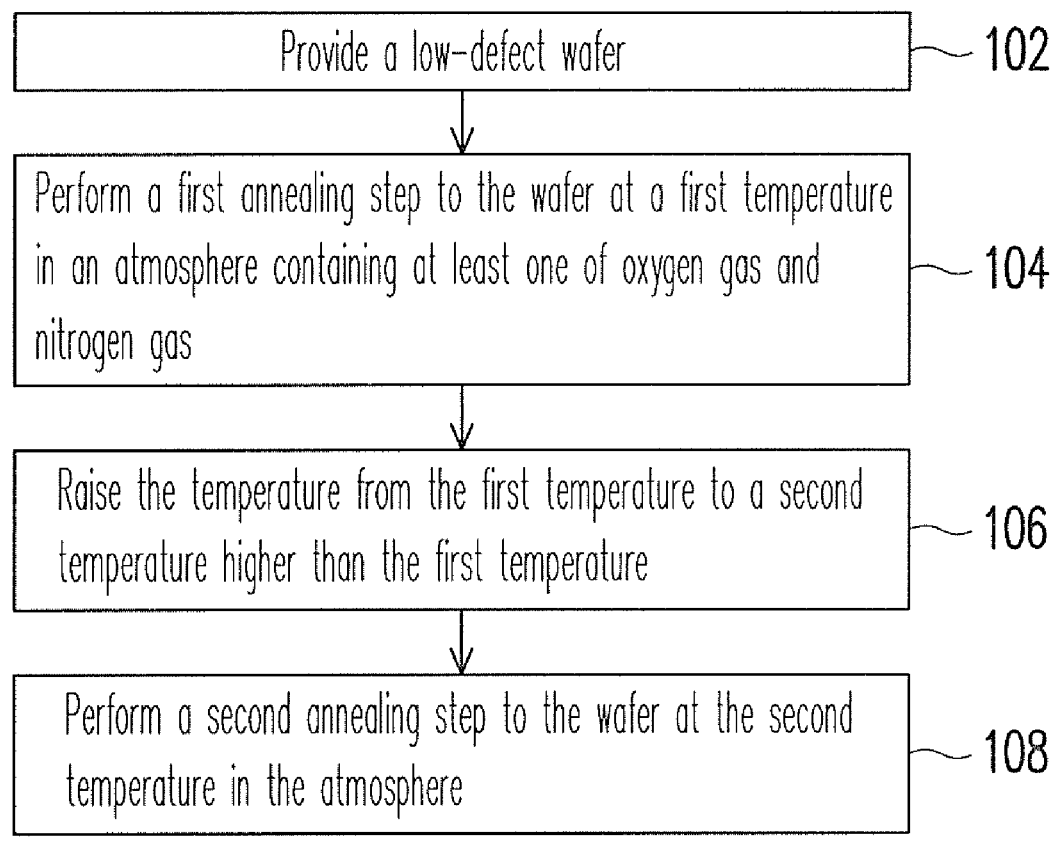
FIG. 1 is a flow chart of a method of improving the intrinsic gettering ability of a wafer according to an embodiment of this invention.

Referring to FIG. 1, a low-defect wafer is provided (step 102), having a micro-defect (BMD) density lower than $3.85 \times 10^5/cm^3$. Such a wafer may be a commercially available Perfect Silicon wafer, which may be cut from a silicon ingot that is formed with an advanced Czochralski method in a lower drawing speed and in a constant ratio of drawing speed to rotation speed.

Thereafter, a first annealing step is performed to the wafer at a first temperature in an atmosphere containing at least one of oxygen gas and nitrogen gas (step 104). The first temperature is usually between 650° C. and 850° C., preferably about 650° C. The first annealing step may be conducted for 4-12 hours, preferably about 8 hours. The atmosphere may contain oxygen gas only or contain nitrogen gas only.

The temperature is then raised from the first temperature to a second temperature higher than the first one (step 106), which is the temperature at which the subsequent second annealing step is conducted. The temperature in the transition period between the first annealing step and the second annealing step is preferably raised in a rate of 1-5° C./min.

Then, a second annealing step is performed to the wafer at the second temperature in the atmosphere (step 108). The second temperature is usually between 1000° C. and 1200° C., preferably about 1000° C. The second annealing step is conducted for 12-16 hours, preferably about 16 hours. The second annealing step is for nuclei growth.

In a preferred embodiment of this invention, the first temperature is between 650° C. and 850° C., particularly 650° C., the first annealing step is conducted for 4-12 hours, particularly 8 hours, the second temperature is between 1000° C. and 1200° C., particularly 1000° C., and the second annealing step is conducted for 12-16 hours, particularly 16 hours. The temperature in the transition period between the first annealing step and the second annealing step is preferably raised in a rate of 1-5° C./min, particularly 1.0° C./min.

EXAMPLES 1-4 & COMPARATIVE EXAMPLES 1-2

In each of Examples 1-4 of this invention, a two-step annealing process was done to a Perfect Silicon wafer having a BMD density lower than $3.85 \times 10^5/cm^3$ in an ambient gas of $O_2$ or $N_2$, wherein the temperature of the second annealing step was fixed at 1000° C. higher than the temperature of the $1^{st}$ annealing step. Comparative Example 1 is different from Example 2/3/4 only in that the temperature (950° C.) of the $1^{st}$ annealing step is above the range of 650-850° C. of this invention. In Comparative Example 2, a single annealing step is done to a Perfect Silicon wafer at 1000° C. in $N_2$ atmosphere. The resulting BMD density in each example is shown in Table 1.

According to the experiment results shown in Table 1, the BMD density of a Perfect Silicon wafer can be much increased by utilizing this invention, so that the intrinsic gettering ability of the Perfect Silicon wafer is greatly improved.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

TABLE 1

|  | [a]Ex. 1 | Ex. 2 | Ex. 3 | Ex. 4 | [b]CEx. 1 | CEx. 2 |
|---|---|---|---|---|---|---|
| Ambient gas | $O_2$ | $N_2$ | $N_2$ | $N_2$ | $N_2$ | $N_2$ |
| Temperature of 1$^{st}$ annealing (° C.) | 650 | 650 | 750 | 850 | 950 | Single annealing at 1000° C. for 16 hours |
| Duration of 1$^{st}$ annealing (hour) | 8 | 8 | 8 | 8 | 8 |  |
| Temperature raising rate (° C./min) in the transition period | 1.0 | 1.0 | 1.0 | 1.0 | 1.0 |  |
| Temperature of 2$^{nd}$ annealing (° C.) | 1000 | 1000 | 1000 | 1000 | 1000 |  |
| Duration of 2$^{nd}$ annealing (hour) | 16 | 16 | 16 | 16 | 16 |  |
| BMD density (/cm$^3$) after the 1$^{st\ and\ the}$ 2$^{nd}$ annealing steps | $4.69\text{-}7.27 \times 10^9$ | $5.52\text{-}5.67 \times 10^9$ | $3.16\text{-}5.37 \times 10^9$ | $1.91\text{-}3.97 \times 10^9$ | $3.85 \times 10^5\text{-}3.38 \times 10^9$ | $3.85 \times 10^5\text{-}3.38 \times 10^9$ |

[a]Ex. = Example of this invention;
[b]CEx. = Comparative Example

What is claimed is:

1. A method of improving intrinsic gettering ability of a wafer, comprising:
    providing a wafer, wherein the wafer provided is a Perfect Silicon wafer;
    performing a first annealing step to the wafer at a first temperature in an atmosphere containing at least one of oxygen gas and nitrogen gas; and
    performing a second annealing step to the wafer, at a second temperature higher than the first temperature, in the atmosphere.

2. The method of claim 1, wherein the wafer provided has a bulk micro-defect (BMD) density lower than $3.85 \times 10^5/\text{cm}^3$.

3. The method of claim 1, wherein the first temperature is between 650° C. and 850° C. and the second temperature is between 1000° C. and 1200° C.

4. The method of claim 3, wherein the first annealing step is conducted for 4-12 hours and the second annealing step is conducted for 12-16 hours.

5. The method of claim 3, wherein a temperature in a transition period between the first annealing step and the second annealing step is raised in a rate of 1-5° C./min.

6. The method of claim 1, wherein the atmosphere contains oxygen gas only.

7. The method of claim 1, wherein the atmosphere contains nitrogen gas only.

8. A method of improving intrinsic gettering ability of a Perfect Silicon wafer, comprising:
    performing a first annealing step to the Perfect Silicon wafer, at a temperature between 650° C. and 850° C. for 4-12 hours, in an atmosphere containing at least one of oxygen gas and nitrogen gas; and
    performing a second annealing step to the Perfect Silicon wafer, at a temperature between 1000° C. and 1200° C. for 12-16 hours, in the atmosphere.

9. The method of claim 8, wherein a temperature in a transition period between the first annealing step and the second annealing step is raised in a rate of 1-5° C./min.

10. The method of claim 8, wherein the atmosphere contains oxygen gas only.

11. The method of claim 8, wherein the atmosphere contains nitrogen gas only.

* * * * *